United States Patent
Hu

(10) Patent No.: US 8,886,972 B2
(45) Date of Patent: Nov. 11, 2014

(54) POWER CONTROL MODULE HAS VOLTAGE SETTING MODULE THAT DETERMINE BURST OPERATING VOLTAGE AND OPERATE DURING EXECUTION OF COMMAND IN FLASH DRIVE

(75) Inventor: Jin-Wei Hu, New Taipei (TW)

(73) Assignee: Transcend Information, Inc., NeiHu Dist, Taipei (TW)

( * ) Notice: Subject to any disclaimer, the term of this patent is extended or adjusted under 35 U.S.C. 154(b) by 301 days.

(21) Appl. No.: 13/530,091

(22) Filed: Jun. 21, 2012

(65) Prior Publication Data

US 2013/0346761 A1   Dec. 26, 2013

(51) Int. Cl.
*G06F 1/26* (2006.01)
(52) U.S. Cl.
USPC .......................... 713/300; 713/320; 365/226
(58) Field of Classification Search
CPC ........... G06F 1/26; G06F 1/28; G06F 1/3206; G06F 1/3225
USPC .................................. 713/300, 320; 365/226
See application file for complete search history.

(56) References Cited

U.S. PATENT DOCUMENTS

| | | | |
|---|---|---|---|
| 5,898,634 A * | 4/1999 | Chevallier ..................... | 365/226 |
| 7,173,859 B2 | 2/2007 | Hemink | |
| 7,653,779 B1 * | 1/2010 | Fein et al. ..................... | 711/103 |
| 7,809,962 B2 | 10/2010 | Chang | |
| 7,835,189 B2 * | 11/2010 | Achter et al. ............ | 365/185.22 |
| 8,040,737 B2 * | 10/2011 | Alrod et al. ............. | 365/185.24 |
| 8,510,636 B2 * | 8/2013 | Ruby et al. ..................... | 714/773 |
| 2003/0111988 A1 * | 6/2003 | Sundaram et al. ............ | 323/283 |

FOREIGN PATENT DOCUMENTS

| | | |
|---|---|---|
| TW | I257106 | 6/2006 |
| TW | I298162 | 6/2008 |

* cited by examiner

*Primary Examiner* — Chun Cao
(74) *Attorney, Agent, or Firm* — Winston Hsu; Scott Margo

(57) ABSTRACT

A power strategy selector queries a lookup table using a current flash status of a flash drive, and determines a burst operating voltage for operating the flash drive. Therefore, precise buffering of parameters or data can be ensured when the flash drive meets an unexpected power failure or malfunctions, or precise operations of the flash drive can be guaranteed.

18 Claims, 5 Drawing Sheets

POWER CONTROL MODULE HAS VOLTAGE SETTING MODULE THAT DETERMINE BURST OPERATING VOLTAGE AND OPERATE DURING EXECUTION OF COMMAND IN FLASH DRIVE

BACKGROUND

1. Technical Field

The present invention discloses a power control module, a flash drive utilizing the power control module, and a method of determining an operating voltage of the flash drive, and more particularly, a power control module providing a burst operating voltage for operating a flash drive, the flash drive having the power control module, and a method of determining the burst operating voltage for operating the flash drive.

2. Description of the Conventional Art

Power requirements of a flash drive are getting higher as a result of a faster access speed and a larger capacity of the flash drive. Therefore, utilizing a constant voltage source for providing power to the flash drive is getting difficult for covering the power requirements.

There are some defects introduced by the higher power requirements of the flash drive. For a first example, the flash drive may malfunction because of an insufficient operating voltage caused from an unstable voltage source. For a second example, data stored by the flash drive may be damaged because of an insufficient operating voltage caused from unexpected power failure of the flash drive.

For neutralizing the abovementioned defects, utilizing more capacitors or capacitors having higher capacitance may significantly increase area and a fabrication cost of printed circuit boards (PCBs) utilized by the flash drive.

SUMMARY

The claimed invention discloses a power control module utilized for a flash drive. The power control module comprises a power strategy selector and a voltage setting module. The power strategy selector is configured to query a lookup table to determine a first burst operating voltage according to a current flash status of the flash drive while a command is received by the flash drive. The voltage setting module is configured to issue a voltage setting command of utilize the first burst operating voltage to operate the flash drive during execution of the command.

The claimed invention discloses a flash drive. The flash drive comprises a memory, a power control module and a power circuit. The memory is utilized for storing a lookup table, which stores connections between a plurality of empirical operating voltages and a plurality of flash statuses of the flash drive. The power control module comprises a power strategy selector and a voltage setting module. The power strategy selector is configured to query the lookup table to determine a first burst operating voltage according to a current flash status of the flash drive while a command is received by the flash drive. The voltage setting module is configured to generate a voltage setting command of utilizing the first burst operating voltage to operate the flash drive during execution of the command. The power circuit is configured to receive the voltage setting command from the voltage setting module to operate the flash drive by utilizing the first burst operating voltage during the execution of the command.

The claimed invention further discloses a method of determining an operating voltage of a flash drive. The method comprises selecting an empirical operating voltage from a plurality of empirical operating voltages according to a current flash status of the flash drive by querying a lookup table while a command is received by the flash drive, wherein the lookup table stores connections between a plurality of empirical operating voltages and a plurality of flash statuses of the flash drive; determining a first burst operating voltage of the flash drive according to the selected empirical operating voltage, wherein the first burst operating voltage is higher than the selected empirical operating voltage; and operating the flash drive by utilizing the first burst operating voltage during execution of the command.

These and other objectives of the present invention will no doubt become obvious to those of ordinary skill in the art after reading the following detailed description of the preferred embodiment that is illustrated in the various figures and drawings.

DETAILED DESCRIPTION

For meeting higher power requirements of a flash drive without the penalty of significantly increased area and fabrication cost of PCBs or without the defects of damaged data and malfunction, the present invention discloses a power control module, a flash drive having the power control module, and a method of determining an operating voltage of the flash drive. The primary concept of the present invention is to provide at least one burst operating voltage to operate the flash drive, so that the operating voltage of the flash drive can be guaranteed to be sufficient anytime when the flash drive is operated to execute a received command, i.e. the flash drive can thus be immune from data damage or malfunction caused by an insufficient operating voltage.

Figure 1:
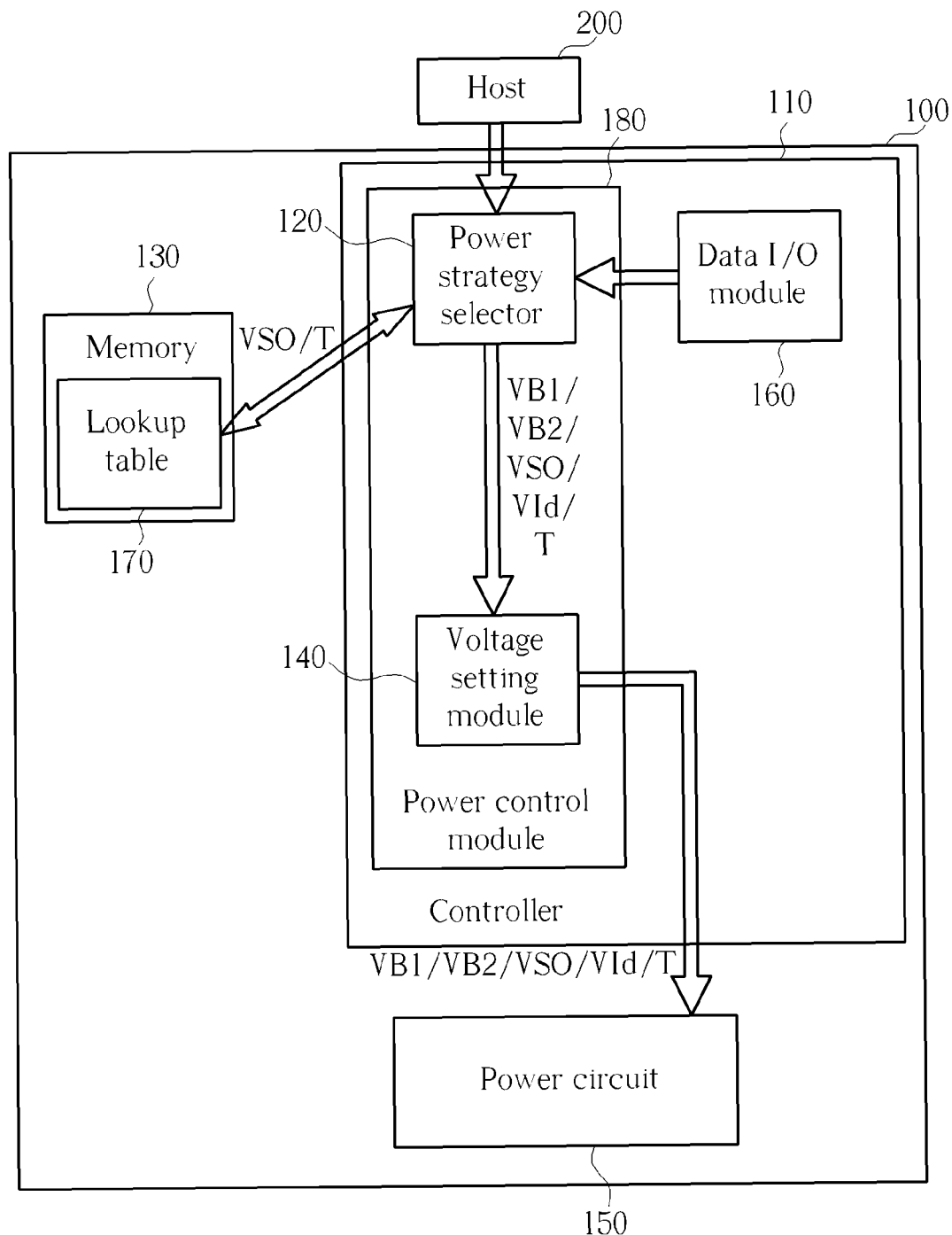
FIG. 1 illustrates how a flash drive including a power control module disclosed in the present invention works to ensure its accuracy in operations, according to one embodiment of the present invention.

Please refer to FIG. 1, which illustrates how a flash drive 100 including a power control module 180 disclosed in the present invention works to ensure its accuracy in operations, according to one embodiment of the present invention. As shown in FIG. 1, the flash drive 100 is electrically connected to a host 200 so that the flash drive 100 is capable of receiving commands from the host 200, where the commands may be I/O commands. The flash drive 100 includes a controller 110, a memory 130 and a power circuit 150. The controller 110 includes the power control module 180 and a Data I/O module 160. The data I/O module 160 is configured to execute a command received from the host 200.

The memory 130 stores a lookup table 170. Connections between a plurality of empirical operating voltages and a plurality of flash statuses of the flash drive 100 are stored in the lookup table 170. The plurality of flash statuses of the flash drive 100 are primarily indicated by the data I/O module 160 while the data I/O module 160 executes a command received from the host 200. The plurality of flash statuses indicated by the data I/O module 160 may be dependent on factors including an operating frequency, a capacity, a type, an interleave state, and/or a number of utilized channels of the flash drive 100; in one embodiment of the present invention, a flash status is a combination of the operating frequency, the capacity, the type, the interleave state, and/or the number of utilized channels of the flash drive 100. Each flash status of the flash drive 100 may be specifically corresponding to an empirical operating voltage of the flash drive 100, so that the correspondence between each the flash status of the flash drive 100 and its corresponding empirical operating voltage can be established according to experimental statistics of the flash drive 100 and be an element of the connections stored in the lookup table 170.

The power circuit 150 is configured to operate the flash drive 100 according to an operating voltage indicated by a voltage setting command from the controller 110.

The power control module 180 includes a power strategy selector 120 and a voltage setting module 140. The power strategy selector 120 is configured to query the lookup table 170 using a current flash status of the flash drive 100, which is provided by the data I/O module 160, as the index in response to occurrence of a command transmitted from the host 200 and received by the flash drive 100, for selecting a corresponding empirical operating voltage from a plurality of empirical operating voltages according to information stored in the lookup table 170, i.e. according to the connections between the plurality of empirical operating voltages and the plurality of flash statuses of the flash drive 100.

The power strategy selector 120 is configured to determine a first burst operating voltage of the flash drive 100 according to the selected empirical operating voltage, which has a lower voltage level than the first burst operating voltage, and to issue a first decision for determining using the first burst operating voltage to the voltage setting module 140. After receiving the first decision, the voltage setting module 140 is configured to issue the voltage setting command to the power circuit 150 to indicate utilizing the first burst operating voltage so that the power circuit 150 utilizes the first burst operating voltage to operate the flash drive 100 in response to the voltage setting command during execution of the command by the data I/O module 160.

How the flash drive 100 operates is described as follows. The lookup table 170 is stored in the memory 130 in advance. When there is a new command issued from the host 200, received by the power control module 110 of the flash drive 100, and to be executed by the data I/O module 160, the power strategy selector 120 queries the lookup table 170 via the memory 130 in response to occurrence of the received command. In querying the lookup table 170, the power strategy selector 120 uses a current flash status indicated by the data I/O module 160 as its index, and will select an empirical operating voltage corresponding to the current flash status via a connection between the current flash status and the selected empirical operating voltage.

The power strategy selector 120 then determines a first burst operating voltage higher than the selected operating voltage and sends a first decision of utilizing the first burst operating voltage to the voltage setting module 140. After receiving the first decision, the voltage setting module 140 issues a voltage setting command to the power circuit 150 according to the first decision. At last, the power circuit 150 uses the first burst operating voltage for operating the flash drive in response to the voltage setting command during execution of the received command by the data I/O module 160.

Note that the purpose of utilizing the first burst operating voltage is to prevent the power circuit 150 from utilizing an operating voltage lower than the selected operating voltage, in case the flash drive 100 meets an unexpected power failure or malfunctions, where utilizing the operating voltage lower than the selected operating voltage may lead to inaccurate operations of the flash drive, such as buffering operations. For example, when the flash drive 100 meets an unexpected power failure or malfunctions, the flash drive 100 may need some additional time for buffering currently-utilized parameters or currently-accessed data before the flash drive 100 is forced to be shut down because of a completely loss of its power; with the aid of utilizing the first burst operating voltage, the flash drive 100 may buy the additional time in precisely buffering since it takes more time for the operating voltage to drop below the empirical operating voltage, which is a guarantee of precise operations of the flash drive.

In some embodiments of the present invention, the command received from the host 200 by the flash drive 100 for execution may be a read command, a write command, a DMA command, or a flash programming command.

In embodiments of the present invention, the data I/O module 160 may be replaced by other modules of the controller 110 for executing corresponding commands from the host, so that the current flash status indicated by the other modules and used as the index to query the lookup table 170 may be changed correspondingly.

Figure 2:
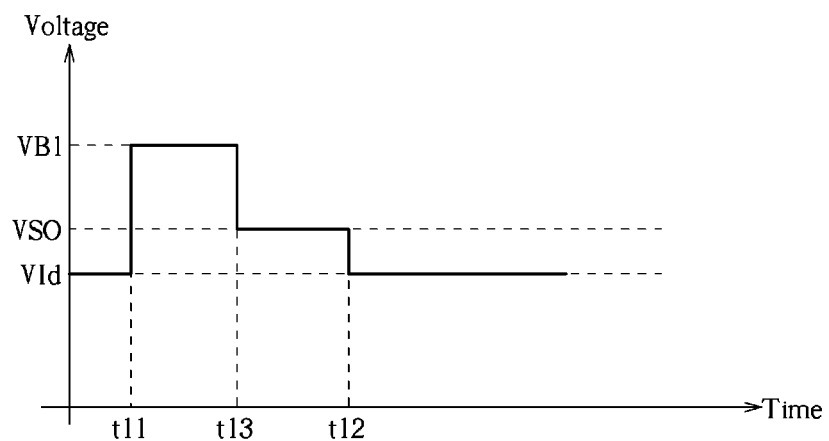
FIGS. 2-4 illustrate how the power strategy selector shown in FIG. 1 determines the operating voltage for the power circuit shown in FIG. 1 after selecting an empirical operating voltage, according to embodiments of the present invention.
Figure 3:
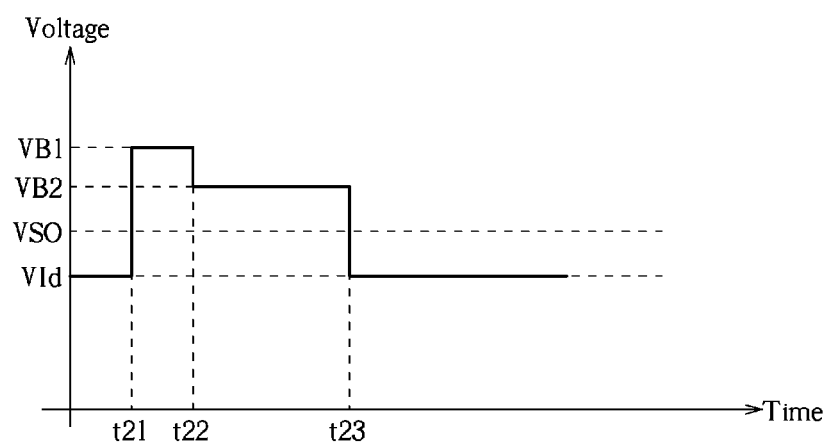
Figure 4:
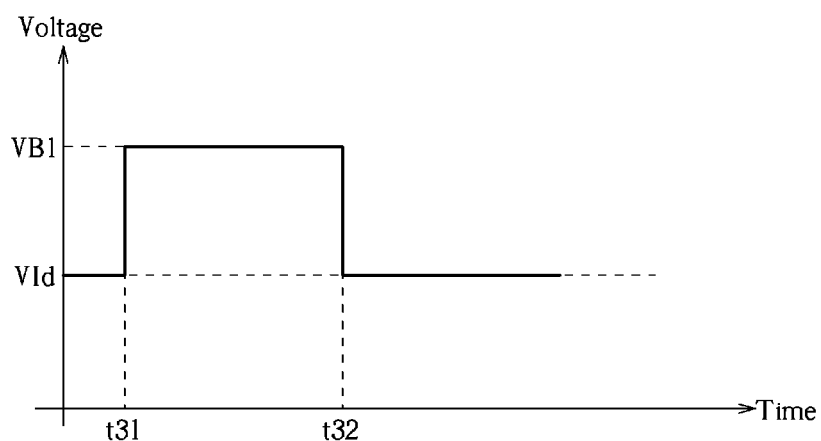

Please also refer to FIGS. 2-4, which illustrate how the power strategy selector 120 determines the operating voltage for the power circuit 150 after selecting an empirical operating voltage VS0, according to embodiments of the present invention. Note that the flash drive 100 is assumed to be idle before receiving the command from the host, so that the power circuit 150 is assumed to utilize an idle voltage VId at the beginning.

In FIG. 2, a moment t11 indicates the moment when the data I/O module 160 starts executing the received command, and a moment t12 indicates the moment when the data I/O module 160 completes the execution of the received command. As can be observed in FIG. 2, at the moment t11, the power strategy selector 120 determines a first burst operating voltage VB1, which is higher than the selected empirical operating voltage VS0, and the power circuit 150 begins utilizing the first burst operating voltage VB1 from the moment t11 until reaching a moment t13. For saving power consumption between the moments t13 and t12 without effecting execution of the received command, the power strategy selector 120 may command the power circuit 150 via the voltage setting module 140 to utilize the selected empirical operating voltage VS0 instead of the first burst voltage VB1, where the selected empirical operating voltage VS0 may also be regarded as an intermediate operating voltage lower than the first burst operating voltage VB1 and no less than the selected empirical operating voltage VS0. When reaching the moment t12, there is no need to guarantee the execution of the received command and the flash drive 100 may enter its idle status, so that the power strategy selector 120 may give another decision to the voltage setting module 140 for commanding the power circuit 150 to utilize the idle voltage VId for rendering the flash drive 100 to enter its idle status.

In one embodiment of the present invention, the power strategy selector 120 may further determine a first duration of utilizing the first burst operating voltage VB1, i.e. a time interval from a moment t11 to a moment t13, and a second duration of utilizing the selected empirical operating voltage VS0, i.e. a time interval from the moment t13 to a moment t12 according to information stored in the lookup table 170 with respect to the current flash status of the flash drive 100 or the received command, and the power circuit 150 then utilizes the first burst operating voltage VB1 for the first duration and the selected empirical operating voltage VS0 for the second duration, according to a corresponding decision of the power strategy selector 120. In another embodiment of the present invention, the power strategy selector 120 may determine a sum of the first duration and the second duration, i.e. a time interval from the moment t11 to the moment t12, to no less than duration required to complete the execution of the received command by the flash drive 100.

Besides guaranteeing the precision of executing the received command, utilizing the first burst operating voltage at the moment t11 may prevent a sudden drop of a utilized operating voltage of the flash drive 100 caused by execution of a highly power-consuming command, such as an I/O command.

In one embodiment of the present invention, the power strategy selector 120 may determine at least two burst operating voltages for saving part of the power consumption as shown in FIG. 2. In FIG. 3, besides the first burst operating voltage VB1, the power strategy selector 120 may further determine a second burst operating voltage VB2, which is higher than the empirical operating voltage VSO and lower than the first burst operating voltage VB1, and generates a decision of utilizing the first burst operating voltage VB1 and the second burst operating voltage VB2 in turn to the voltage setting module 140 for commanding the power circuit 150 to utilize the first burst operating voltage VB1 and the second burst operating voltage VB2 in turn. Note that the second burst operating voltage VB2 may also be regarded as an intermediate operating voltage lower than the first burst operating voltage VB1 and no less than the selected empirical operating voltage VSO. Similar as FIG. 2, the power strategy selector 120 may determine utilizing the empirical operating voltage VSO after utilizing the first burst operating voltage VB1 and the second burst operating voltage VB2 in turn.

In one embodiment of the present invention, the power strategy selector 120 may further determine a first duration of utilizing the first burst operating voltage VB1, i.e. a time interval from a moment t21 to a moment t22, and a second duration of utilizing the second burst operating voltage VB2, i.e. a time interval from the moment t22 to a moment t23, and the power circuit 150 then utilizes the first burst operating voltage VB1 for the first duration and the second burst operating voltage VB2 for the second duration, according to a corresponding decision of the power strategy selector 120, where the moment t21 indicates the beginning of executing the received command by the flash drive 100. In another embodiment of the present invention, the power strategy selector 120 may determine a sum of the first duration and the second duration, i.e. a time interval from the moment t21 to the moment t23, to be no less than duration required to complete the execution of the received command by the flash drive 100.

In one embodiment of the present invention, after utilizing all of the burst operating voltages, such as the first burst operating voltage VB1 or the second burst operating voltage VB2, or after the completion of executing the received command, the flash drive 100 may enter its idle state, so that the power strategy selector 120 may determine utilizing the idle voltage VId to operate the flash drive 100, as shown in FIGS. 2-4. Note that in FIG. 4, the moment t31 indicates the beginning of the execution of the received command by the flash drive 100, and the moment t32 indicates an end of utilizing the first burst operating voltage VB1 at or after the complete execution of the received command. Note that using the first burst operating voltage VB1 after the complete execution of the received command may guarantee better precision of executing the received command. In another embodiment of the present invention, duration of utilizing the idle voltage VId may also be determined by the power strategy selector 120 by referencing to the information stored in the lookup table 170. Although the embodiment shown in FIG. 4 may introduce higher power consumption than the embodiment shown in FIG. 2, the embodiment shown in FIG. 4 guarantees precise execution of the received command in a more secured manner since it is more unlikely that the utilized operating voltage of the power circuit 150 falls below the empirical operating voltage VSO during execution of the received command.

In view of the descriptions related to FIGS. 2-4, when the power strategy selector 120 queries the lookup table 170, the memory 130 may return information indicating the selected operating voltage VSO and/or at least one duration T for respectively utilizing at least one burst operating voltage higher than the selected operating voltage, a selected empirical operating voltage, or even an idle voltage. When the power strategy selector 120 transmits a decision to the voltage setting module 140, and when the voltage setting module 140 issues the voltage setting command in response to the decision to the power control circuit 150 for operating the flash drive 100, both the decision and the voltage setting command may selectively carry information about the first burst operating voltage VB1, the second burst operating voltage VB2, the empirical operating voltage VSO, the idle voltage VId, and/or the duration T, as shown in FIG. 1.

Figure 5:
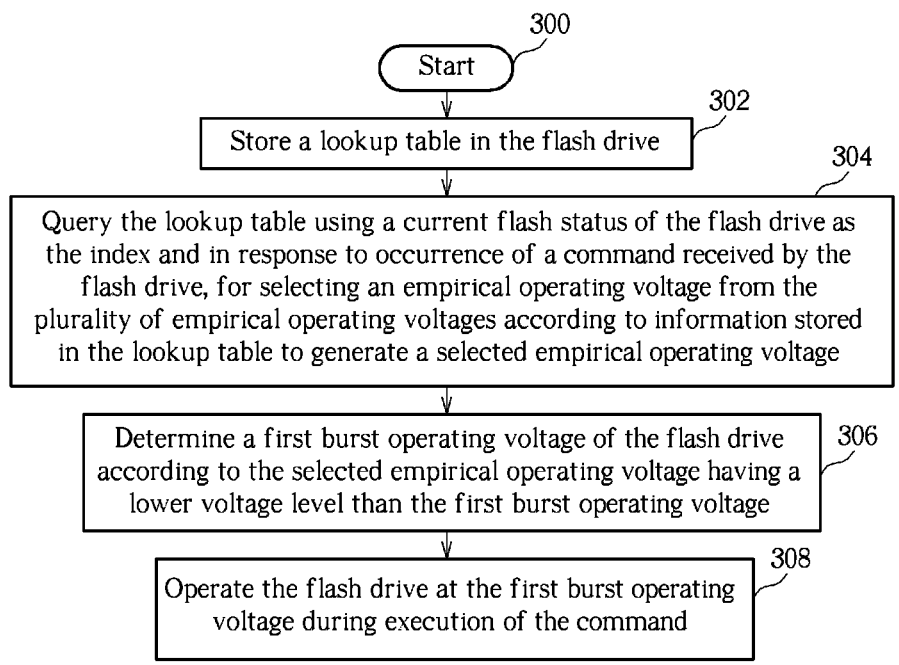
FIG. 5 illustrates the method of determining an operating voltage of a flash drive according to embodiments of the present invention.

Please refer to FIG. 5, which illustrates the method of determining an operating voltage of a flash drive according to descriptions related to FIGS. 1-4. As shown in FIG. 5, the method includes steps as the following:

Step 300: Start.

Step 302: Store a lookup table, which stores connections between a plurality of empirical operating voltages and a plurality of flash statuses of the flash drive, in the flash drive.

Step 304: Query the lookup table using a current flash status of the flash drive as the index and in response to occurrence of a command received by the flash drive, for selecting an empirical operating voltage from the plurality of empirical operating voltages according to information stored in the lookup table to generate a selected empirical operating voltage.

Step 306: Determine a first burst operating voltage of the flash drive according to the selected empirical operating voltage having a lower voltage level than the first burst operating voltage.

Step 308: Operate the flash drive at the first burst operating voltage during execution of the command.

Embodiments formed by reasonable combination and/or permutation of steps shown in FIG. 5 or by adding limitations mentioned above should also be regarded as embodiments of the present invention.

The present invention discloses a power control module, a flash drive having the power control module, and a method of determining an operating voltage of the flash drive. With the aid of the present invention, the operating voltage for operating the flash drive can be higher than an empirical operating voltage for ensuring precise buffering of parameters or data when the flash drive meets an unexpected power failure or malfunctions or for guaranteeing precise operations of the flash drive.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power control module utilized for a flash drive, comprising:
   a power strategy selector, configured to query a lookup table to determine a first burst operating voltage according to a current flash status of the flash drive while a command is received by the flash drive, wherein the current flash status of the flash drive specifically corresponds to an empirical operating voltage of the flash drive, and the first burst operating voltage is higher than the empirical operating voltage; and
   a voltage setting module, configured to issue a voltage setting command of utilize the first burst operating voltage to operate the flash drive during execution of the command.

2. The power control module of claim 1, wherein the first burst operating voltage is determined by selecting the empirical operating voltage from the lookup table, and connections between a plurality of empirical operating voltages and a plurality of flash statuses of the flash drive are stored in the lookup table.

3. The power control module of claim 2, wherein the power strategy selector is further configured to determine an intermediate operating voltage to operate the flash drive after utilizing the first burst operating voltage, wherein the intermediate operating voltage is lower than the first burst operating voltage but no less than the selected empirical operating voltage.

4. The power control module of claim 3, wherein the power strategy selector is further configured to query the lookup table for respectively determining a first duration of utilizing the first burst operating voltage and a second duration of utilizing the intermediate operating voltage to operate the flash drive; and wherein a sum of the first duration and the second duration is no less than a duration required by the flash drive to execute the command.

5. The power control module of claim 2, wherein the plurality of flash statuses are dependent on factors comprising an operating frequency, a capacity, a type, an interleave state, and a number of utilized channels of the flash drive.

6. The power control module of claim 1, wherein the power strategy selector is further configured to determine duration of utilizing the first burst operating voltage to operate the flash drive, and the determined duration is no less than a required duration of the flash drive to execute the command.

7. A flash drive, comprising:
   a memory for storing a lookup table, which stores connections between a plurality of empirical operating voltages and a plurality of flash statuses of the flash drive;
   a power control module, comprising:
      a power strategy selector, configured to query the lookup table to determine a first burst operating voltage according to a current flash status of the flash drive while a command is received by the flash drive, wherein the current flash status of the flash drive specifically corresponds to an empirical operating voltage of the flash drive, and the first burst operating voltage is higher than the empirical operating voltage; and
      a voltage setting module, configured to generate a voltage setting command of utilizing the first burst operating voltage to operate the flash drive during execution of the command; and
   a power circuit, configured to receive the voltage setting command from the voltage setting module to operate the flash drive by utilizing the first burst operating voltage during the execution of the command.

8. The flash drive of claim 7, wherein the first burst operating voltage is determined by selecting the empirical operating voltage from the lookup table.

9. The power control module of claim 8, wherein the power strategy selector is further configured to determine an intermediate operating voltage to operate the flash drive after utilizing the first burst operating voltage; and
   wherein the intermediate operating voltage is lower than the first burst operating voltage but no less than the selected empirical operating voltage.

10. The power control module of claim 9, wherein the power strategy selector is further configured to query the lookup table for respectively determining a first duration of utilizing the first burst operating voltage and a second duration of utilizing the intermediate operating voltage to operate the flash drive, wherein a sum of the first duration and the second duration is no less than a duration required by the flash drive to execute the command.

11. The flash drive of claim 7, wherein the power strategy selector is further configured to determine duration of utilizing the first burst operating voltage, and the determined duration is no less than a required duration of the flash drive to execute the command.

12. The flash drive of claim 7, wherein the plurality of flash statuses are dependent on factors comprising an operating frequency, a capacity, a type, an interleave state, and a number of utilized channels of the flash drive.

13. A method of determining an operating voltage of a flash drive, comprising:
   selecting an empirical operating voltage from a plurality of empirical operating voltages according to a current flash status of the flash drive by querying a lookup table while a command is received by the flash drive, wherein the lookup table stores connections between a plurality of empirical operating voltages and a plurality of flash statuses of the flash drive and each flash status of the flash drive specifically corresponds to an empirical operating voltage of the flash drive;
   determining a first burst operating voltage of the flash drive according to the selected empirical operating voltage, wherein the first burst operating voltage is higher than the selected empirical operating voltage; and
   operating the flash drive by utilizing the first burst operating voltage during execution of the command.

14. The method of claim 13 further comprising determining duration of utilizing the first burst operating voltage by querying the lookup table, wherein the determined duration is no less than a required duration of the flash drive to execute the command.

15. The method of claim 13 further comprising:
   determining an intermediate operating voltage which is lower than the first burst operating voltage but no less than the selected empirical operating voltage; and
   operating the flash drive by utilizing the intermediate operating voltage after utilizing the first burst operating voltage during the execution of the command.

16. The method of claim 15 further comprising determining a total duration of utilizing the intermediate operating voltage and the first burst operating voltage, wherein the total duration is no less than a required duration of the flash drive to execute the command.

17. The method of claim 15, further comprising utilizing an idle voltage to operate the flash drive after the execution of the command is completed by the flash drive, wherein the idle voltage is lower than the selected empirical operating voltage.

18. The method of claim 13, further comprising utilizing an idle voltage to operate the flash drive after the execution of the command is completed by the flash drive, wherein the idle voltage is lower than the selected empirical operating voltage.

* * * * *